United States Patent
Yang et al.

(10) Patent No.: US 9,379,198 B2
(45) Date of Patent: Jun. 28, 2016

(54) INTEGRATED CIRCUIT STRUCTURE HAVING SELECTIVELY FORMED METAL CAP

(71) Applicant: GLOBALFOUNDRIES INC., Grand Cayman (KY)

(72) Inventors: Chih-Chao Yang, Glenmont, NY (US); David V. Horak, Essex Junction, VT (US); Charles W. Koburger, Delmar, NY (US); Shom Ponoth, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1 day.

(21) Appl. No.: 14/494,699

(22) Filed: Sep. 24, 2014

(65) Prior Publication Data

US 2015/0008527 A1 Jan. 8, 2015

Related U.S. Application Data

(62) Division of application No. 13/233,064, filed on Sep. 15, 2011, now Pat. No. 8,877,645.

(51) Int. Cl.
*H01L 29/423* (2006.01)
*H01L 29/49* (2006.01)
*H01L 29/51* (2006.01)
(Continued)

(52) U.S. Cl.
CPC .... *H01L 29/42372* (2013.01); *H01L 21/28247* (2013.01); *H01L 21/7685* (2013.01); *H01L 21/76834* (2013.01); *H01L 21/76856* (2013.01); *H01L 21/76888* (2013.01); *H01L 21/76897* (2013.01); *H01L 29/495* (2013.01); *H01L 29/517* (2013.01); *H01L 29/78* (2013.01)

(58) Field of Classification Search
CPC ............... H01L 21/76834; H01L 21/7685; H01L 21/76886; H01L 21/76888; H01L 21/28247; H01L 29/517
See application file for complete search history.

(56) References Cited

U.S. PATENT DOCUMENTS 5,549,808 A * 8/1996 Farooq et al. .................. 205/123
5,585,673 A   12/1996 Joshi et al.
(Continued)

FOREIGN PATENT DOCUMENTS

KR   19960013638 B1   10/1996
KR   20010057491 A    4/2001

OTHER PUBLICATIONS

Dakhel et al., "Correlated Structural and Electrical Properties of Thin Manganese Oxide Films", Thin Solid Films 496 (2006), 353-359.
(Continued)

*Primary Examiner* — Ermias Woldegeorgis
*Assistant Examiner* — John Bodnar
(74) *Attorney, Agent, or Firm* — Yuanmin Cai; Hoffman Warnick LLC

(57) ABSTRACT

An integrated circuit structure with a selectively formed and at least partially oxidized metal cap over a gate. In one embodiment, an integrated circuit structure has: a substrate; a metal gate located over the substrate; at least one liner layer over the substrate and substantially surrounding the metal gate; and an at least partially oxidized etch stop layer located directly over the metal gate, the etch stop layer including at least one of cobalt (Co), manganese (Mn), tungsten (W), iridium (Ir), rhodium (Rh) or ruthenium (Ru).

13 Claims, 7 Drawing Sheets

(51) Int. Cl.
*H01L 21/28* (2006.01)
*H01L 21/768* (2006.01)
*H01L 29/78* (2006.01)

(56) References Cited

U.S. PATENT DOCUMENTS

| | | | |
|---|---|---|---|
| 5,695,810 | A | 12/1997 | Dubin et al. |
| 6,171,957 | B1* | 1/2001 | Maekawa ............... 438/672 |
| 6,255,164 | B1 | 7/2001 | Liu et al. |
| 6,323,554 | B1 | 11/2001 | Joshi et al. |
| 6,342,733 | B1 | 1/2002 | Hu et al. |
| 6,706,625 | B1 | 3/2004 | Sudijono et al. |
| 6,908,806 | B2 | 6/2005 | Yang et al. |
| 7,026,689 | B2 | 4/2006 | Liaw |
| 7,790,631 | B2 | 9/2010 | Sharma et al. |
| 7,884,475 | B2 | 2/2011 | Gambino et al. |
| 8,120,114 | B2* | 2/2012 | Ott et al. ............... 257/364 |
| 2001/0003063 | A1 | 6/2001 | Hu et al. |
| 2004/0113279 | A1 | 6/2004 | Chen et al. |
| 2004/0175910 | A1 | 9/2004 | Pan et al. |
| 2008/0157365 | A1 | 7/2008 | Ott et al. |
| 2008/0315426 | A1 | 12/2008 | Yang et al. |
| 2009/0283922 | A1 | 11/2009 | Rachmady et al. |
| 2010/0038713 | A1* | 2/2010 | Majhi et al. ........... 257/344 |
| 2010/0048013 | A1 | 2/2010 | Thei et al. |
| 2010/0068876 | A1 | 3/2010 | Lin et al. |
| 2011/0031562 | A1 | 2/2011 | Lin et al. |
| 2011/0156107 | A1* | 6/2011 | Bohr et al. ............. 257/288 |

OTHER PUBLICATIONS

Au et al., "Selective Chemical Vapor Deposition of Manganese Self-Aligned Capping Layer for Cu Interconnections in Microelectronics", Journal of the Electrochemical Society, 157 (6) D341-D345 (2010).
U.S. Appl. No. 13/233,064, Office Action dated Jan. 9, 2014.
U.S. Appl. No. 13/233,064, Office Action dated Oct. 30, 2013.
U.S. Appl. No. 13/233,064, Office Action dated Jul. 30, 2013.
U.S. Appl. No. 13/233,064, Office Action dated Mar. 1, 2013.
U.S. Appl. No. 13/233,064, Notice of Allowance and Fees Due dated Jul. 3, 2014.
Mayuzumi Satoru, et al., High-Performance Metal/High-k-n-and p-MOSFETs with Top-Cut Dual Stress Liner Using Gate-Last Damascene Process on (100) Substrates. IEEE Transactions on Electron Devices; Apr. 2009, vol. 56 No. 4, pp. 620-625.
PCT Notification of Transmittal of the International Search Report and the Written Opinion of the International Searching Authority, or the Declaration dated Jan. 10, 2013.

* cited by examiner

INTEGRATED CIRCUIT STRUCTURE HAVING SELECTIVELY FORMED METAL CAP

BACKGROUND

The subject matter disclosed herein relates to a method of forming an integrated circuit and the structure formed thereby. More specifically, aspects of the invention relate to forming borderless contact to a transistor.

Conventionally, forming self-aligned contacts in transistors having full-metal gates (FMG) involves using a dielectric cap and a high-k material layer over the cap, which acts as an etch-stop layer during the self-alignment process. The dielectric cap and high-k material combination is also useful in forming replacement metal gates (RMG). However, the high-k material must be formed after the dielectric cap in the RMG scenario. In this scenario, the high-k material remains in the final integrated circuit device (including the structure). The presence of this high-k layer in the final integrated circuit device increases the capacitance effects within the integrated circuit. This increased capacitance can adversely affect the performance of the device.

BRIEF SUMMARY

Methods of forming an integrated circuit structure utilizing a selectively formed and at least partially oxidized metal cap over a gate are disclosed. In one embodiment, a method includes providing a precursor structure including a transistor having a metal gate; forming an etch stop layer over an exposed portion of the metal gate; at least partially oxidizing the etch stop layer; and forming a dielectric layer over the at least partially oxidized etch stop layer.

A first aspect of the disclosure includes a method including: providing a precursor structure including a transistor having a metal gate; forming an etch stop layer over an exposed portion of the metal gate; at least partially oxidizing the etch stop layer; and forming a dielectric layer over the at least partially oxidized etch stop layer.

A second aspect of the disclosure includes a method of forming an integrated circuit structure, the method including: forming a transistor structure having an exposed metal gate and spacers adjacent the exposed metal gate; depositing an etch stop layer over the exposed metal gate, exclusive of the spacers; oxidizing substantially an entirety of the etch stop layer; and forming a dielectric layer over the etch stop layer.

A third aspect of the disclosure includes an integrated circuit structure having: a substrate; a metal gate located over the substrate; at least one liner layer over the substrate and substantially surrounding the metal gate; and an at least partially oxidized etch stop layer located directly over the metal gate, the etch stop layer including at least one of cobalt (Co), manganese (Mn), tungsten (W), iridium (Ir), rhodium (Rh) or ruthenium (Ru).

A fourth aspect of the disclosure includes a integrated circuit structure having: a substrate; a metal gate located over the substrate; at least one liner layer over the substrate and substantially surrounding the metal gate; an at least partially oxidized etch stop layer located directly over the metal gate, the etch stop layer including at least one of cobalt (Co), manganese (Mn), tungsten (W), iridium (Ir), rhodium (Rh) or ruthenium (Ru), wherein the at least partially oxidized etch stop layer has a thickness of approximately 0.5 nanometers (nm); and a dielectric layer over the at least partially oxidized etch stop layer.

A fifth aspect of the disclosure includes An integrated circuit structure including: a transistor structure having: a metal gate; a metal liner contacting the metal gate; a high-k liner surrounding the metal liner; spacers abutting the high-k liner; and a conductive layer below and alongside at least one of the spacers; an at least partially oxidized etch stop layer over only the metal gate, the metal liner and the high-k liner, exclusive of the spacers; a dielectric layer over the etch stop layer; and a contact contacting the conductive layer through the dielectric layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
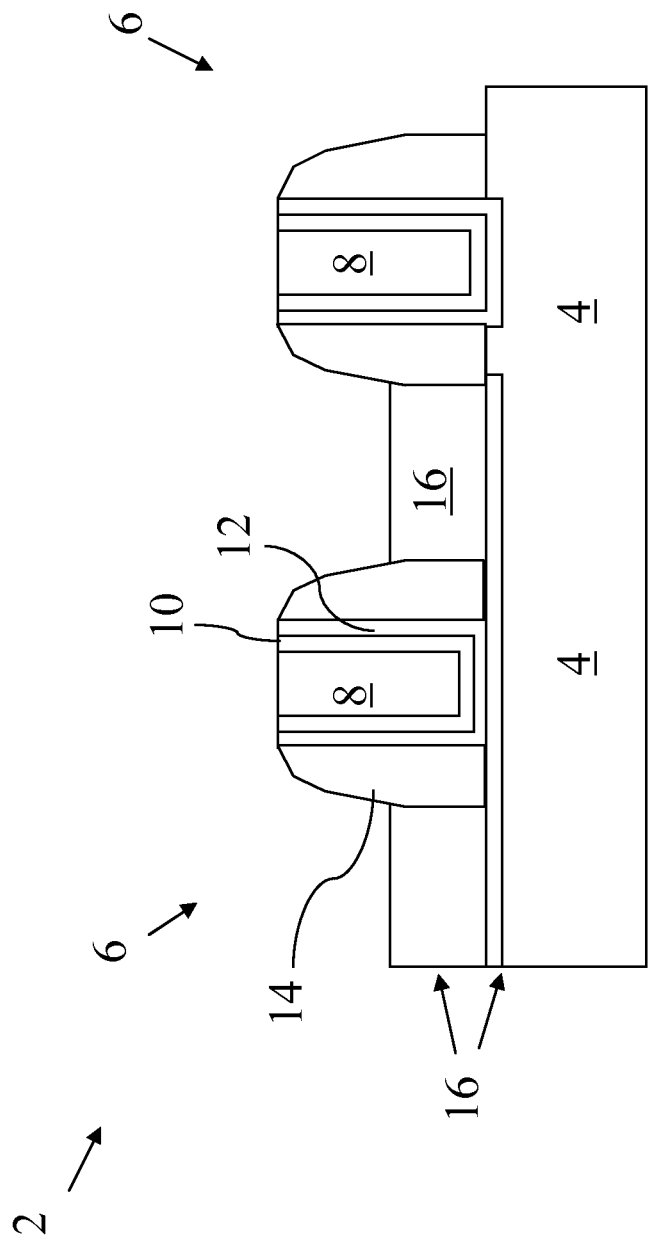
FIG. 1 shows a cross-sectional view of a conventional integrated circuit structure.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

The subject matter disclosed herein relates to methods of forming an integrated circuit structure having an at least partially oxidized metal cap over a gate, and the structures so formed. More specifically, aspects of the invention provide for an integrated circuit structure having a selectively formed and at least partially oxidized metal cap, and solutions for forming such a structure.

In one embodiment, aspects of the invention include a method of forming an integrated circuit structure. The method can include selectively forming (e.g., depositing) a metal over an exposed portion of a metal gate, where the metal gate is substantially contained within an adjacent metal liner and a high-k liner layer, respectively. The metal can be deposited in one of several manners, including chemical vapor deposition (CVD), atomic layer deposition (ALD), or electroless deposition, to a thickness of approximately 0.5-10 nanometers. The metal is then oxidized to form an etch stop layer selectively located over the metal gate. In some cases, the metal is only partially oxidized, leaving an outer region oxidized and a core region non-oxidized, where the core region contacts the metal gate directly.

Another embodiment includes a method of forming an integrated circuit structure, the method including: forming a transistor structure having an exposed metal gate; selectively depositing an etch stop layer over the exposed metal gate; oxidizing substantially an entirety of the etch stop layer; and forming a dielectric layer over the etch stop layer.

Another embodiment includes an integrated circuit structure having a metal gate and a selectively deposited etch stop layer formed directly over the metal gate. The etch stop layer is at least partially oxidized, and can include one or more of cobalt (Co), manganese (Mn), tungsten (W), iridium (Ir), rhodium (Rh) or ruthenium (Ru). In one embodiment, an inner (or, core) region of the etch stop layer is not oxidized, and an outer portion of the etch stop layer is oxidized. In another embodiment, substantially all of the etch stop layer is oxidized.

Turning to FIG. 1, a cross-sectional view of a prior art precursor integrated circuit (IC) structure 2 is shown. As will be described further herein, this precursor IC structure 2 can be subsequently processed according to embodiments in order to form an unconventional integrated circuit structure. As shown, the precursor IC structure 2 includes a conventional substrate 4. The substrate 4 can include at least one of silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 4 may be strained.

The precursor IC structure 2 further includes two conventional transistor structures 6 (e.g., field-effect transistors or FETS) formed over the substrate 4. As formation of these conventional transistor structures 6 is known in the art, the description of the method used to form these transistor structures 6 is omitted herein. Additionally, processes described herein may be applied to one or more of these conventional transistor structures 6, although these processes may be described with reference to only a single transistor structure 6 herein.

In some embodiments, one or more transistor structure 6 can include a metal gate 8, which can be formed of one or more of aluminum (Al), copper (Cu), rhodium (Rh), iridium (Ir), ruthenium (Rh) or tungsten (W). Transistor structure 6 can also include a metal liner 10 lining the metal gate 8, where the metal liner 10 includes one or more of tantalum (e.g., tantalum nitride, TaN), tungsten (e.g., tungsten nitride, WN) or titanium (e.g., titanium nitride, TiN). The metal liner 10 contacts the metal gate 8 and can substantially surround or encompass the metal gate 8. Surrounding the metal liner 10 is a high-k (or, high-dielectric constant) liner 12, which can be formed of any high dielectric constant material, e.g., metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$), or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity).

The high-k liner 12 is abutted by spacers 14, which can be formed of conventional spacer materials (e.g., silicon nitride, $Si_3N_4$). These spacers 14 are located approximately adjacent, or proximate the metal gate 8, and can substantially surround the metal gate 8. Also shown included in the transistor structures 6 are conductive layers 16, which can be formed of any suitable contact metals for performing functions associated with the transistor structures 6.

Figure 2:
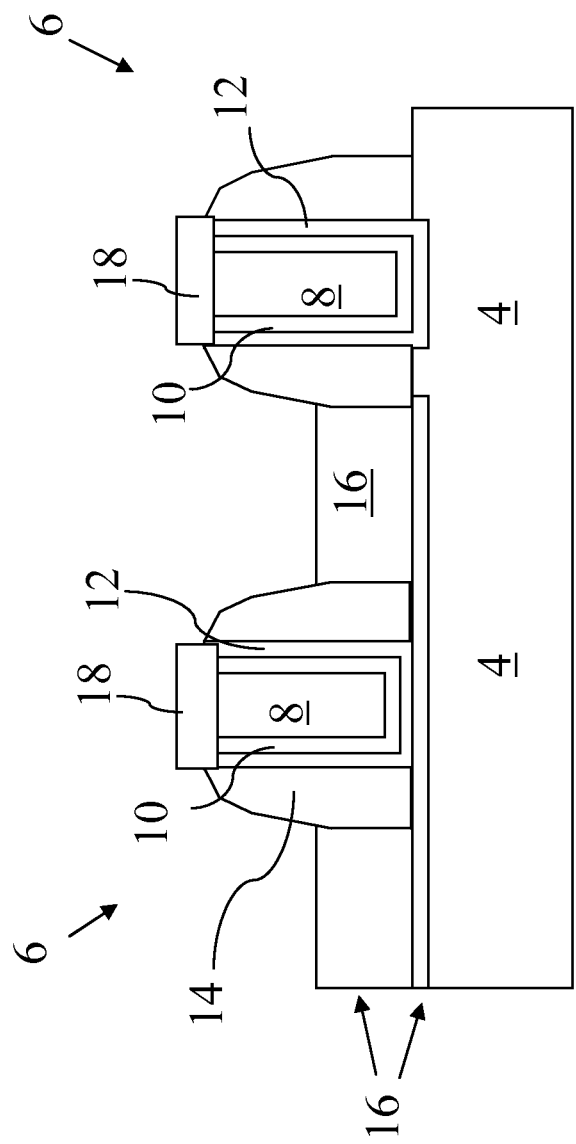
FIG. 2 shows a cross-sectional view of the integrated circuit structure of FIG. 1 after a processing step performed according to embodiments.

FIG. 2 illustrates a process performed to the precursor integrated circuit structure 2 of FIG. 1, where this process is part of a method performed according to embodiments. As shown, FIG. 2 illustrates selectively forming an etch stop layer (e.g., a metal etch stop) 18 to the metal gate 8. In one embodiment, the etch stop layer 18 can be formed over the metal gate 8 by one or more selective deposition techniques, including, chemical vapor deposition (CVD), atomic layer deposition (ALD), or electroless deposition. The etch stop layer 18 can be deposited to a thickness of approximately 0.5-10 nanometers (nm) in some embodiments. The etch stop layer 18 can include one or more of cobalt (Co), manganese (Mn), or ruthenium (Ru). In some embodiments, the etch stop layer 18 is formed selectively over only the metal gate 8. In other embodiments, the etch stop layer 18 is formed selectively to the metal gate 8 as well as the metal liner 10 and the high-k liner 12. The deposition technique can be selective to the top, or planar portion of the semiconductor structure 6, and exclusive of the spacers 14. As used herein, the term "selective" can be an inclusive term, such that forming a first layer "selective" to second layer means that the first layer is formed only over the second layer. As such, the layer is formed exclusive of other, unnamed layers (e.g., adjacent layer) in some embodiments.

As will be described further herein, selectively forming the etch stop layer 18 to the metal gate 8 allows for electrical insulation of the metal gate with decreased capacitive effects when compared with conventional integrated circuit structures that utilize an entire high-k layer overlying both the gate and spacers. The contrast between the metal gate 8 material and the surrounding insulator materials (e.g., the spacers 14) allows for deposition of the etch stop layer 18 selective to the metal gate 8.

Figure 3:
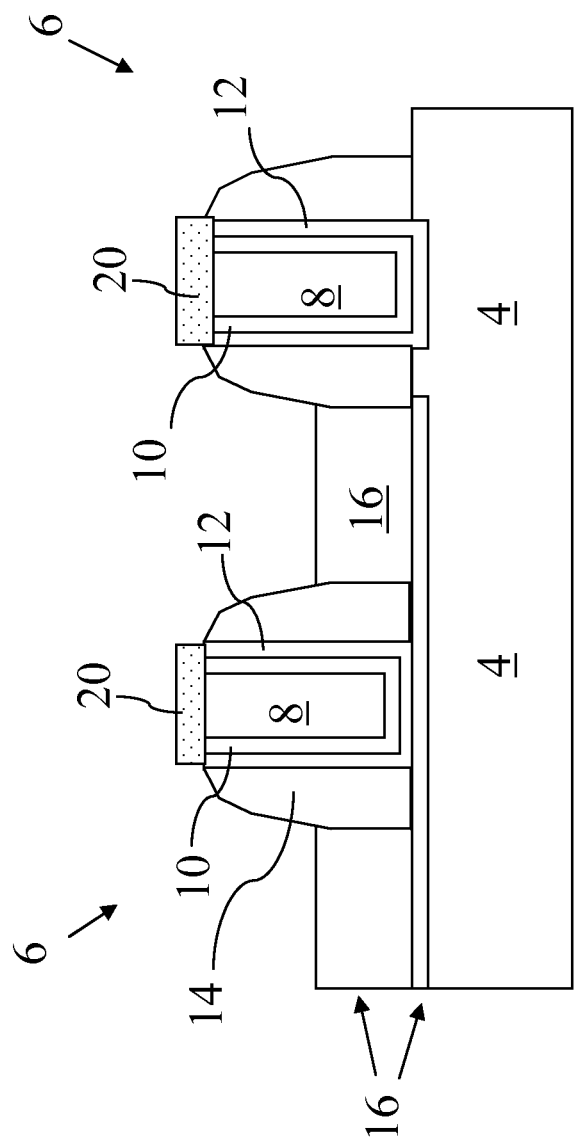
FIG. 3 shows a cross-sectional view of the integrated circuit structure of FIG. 2 after a processing step performed according to embodiments.

FIG. 3 illustrates the process of at least partially oxidizing the etch stop layer 18 of FIG. 2 to form an oxidized metal etch stop layer (or, oxidized etch stop) 20. The oxidized etch stop 20 can be partially oxidized, or completely oxidized through a plasma-contained process, or a thermal process within an oxygen-contained or an ozone-contained ambient. The oxidation process allows the oxidized etch stop 20 to act as an effective insulator between the metal gate 8 and a subsequently formed contact layer (as shown and described with reference to FIGS. 6 and 7). As shown, FIG. 3 illustrates a completely oxidized etch stop 20 according to embodiments.

Figure 4:
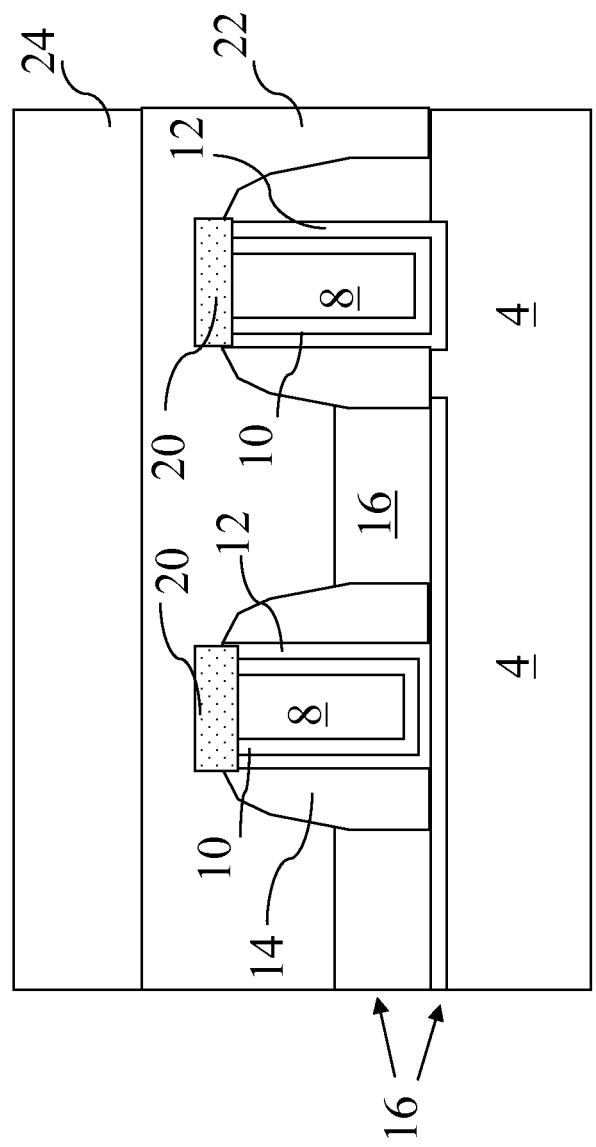
FIG. 4 shows a cross-sectional view of the integrated circuit structure of FIG. 3 after a processing step performed according to embodiments.

FIG. 4 illustrates the process of forming a dielectric layer 22 and dielectric layer 24 over the structure of FIG. 3. The dielectric layers 22, 24 can include one or more conventional dielectric materials such as, silicon dioxide ($SiO_2$), silicon nitride (Si3N4), silicon carbide (SiC), oxygen and hydrogen-doped silicon carbide (SiCOH), etc. These dielectric layers 22, 24 can be formed using conventional techniques such as chemical vapor deposition, spin-on methods, etc. It is understood that these dielectric layers 22, 24 can be formed as a single dielectric layer, or as multiple dielectric layers, as is known in the art.

Figure 5:
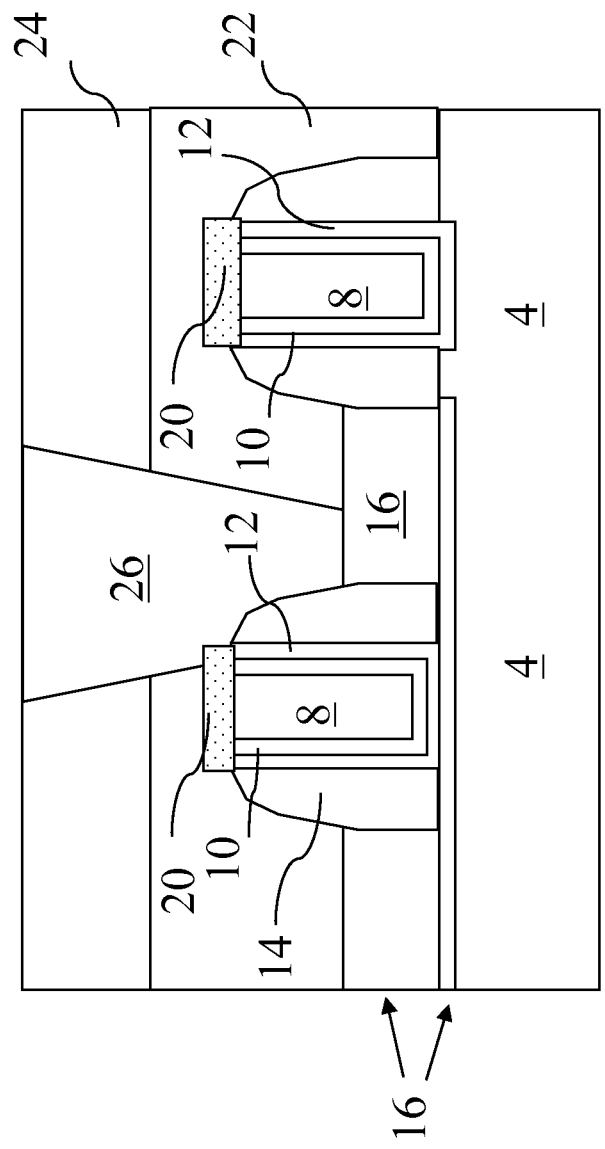
FIG. 5 shows a cross-sectional view of the integrated circuit structure of FIG. 4 after a processing step performed according to embodiments.
Figure 6:
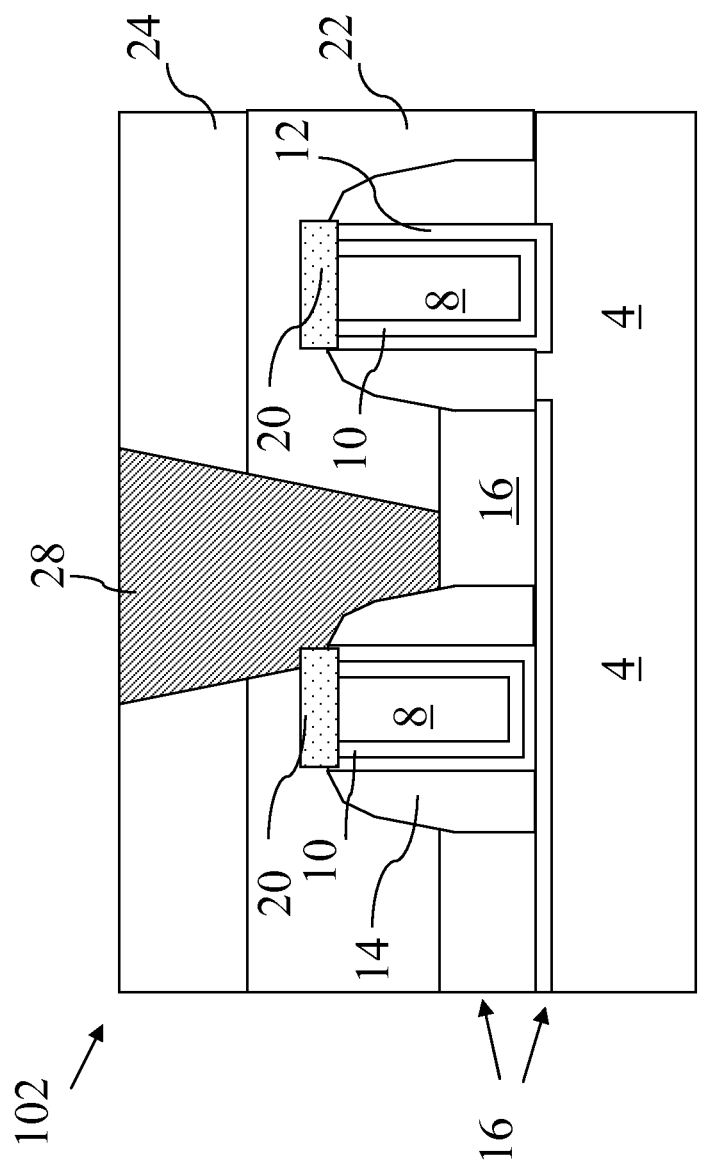
FIG. 6 shows a cross-sectional view of an integrated circuit structure according to embodiments.
Figure 7:
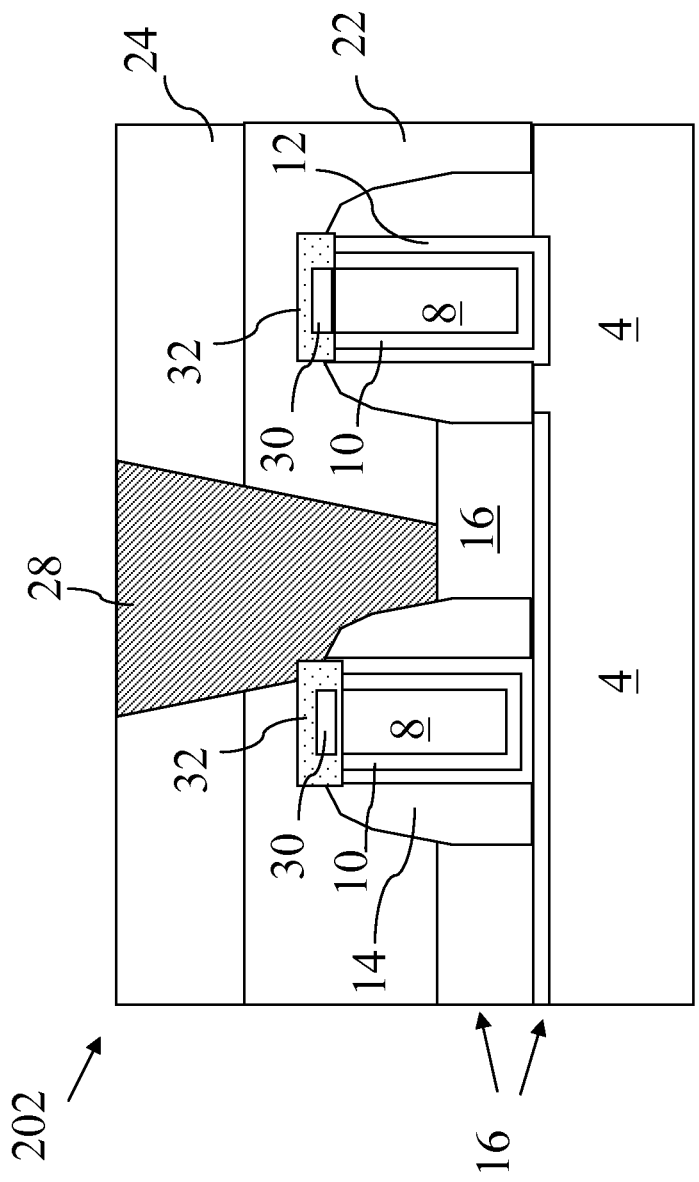
FIG. 7 shows a cross-sectional view of an integrated circuit structure according to alternative embodiments.

FIG. 5 illustrates the process of forming an opening 26 in the dielectric layer 22 and dielectric layer 24, respectively. The opening 26 is formed to expose the conductive layers 16, alongside the spacer 14, for subsequent formation of a contact (FIGS. 6 and 7). The opening 26 can be formed using any conventional etching technique, and is preferably selectively formed (anisotropically). In some cases, the opening 26 can be self-aligned, that is, formation of the opening 26 is dictated by the etch-resistant properties of the underlying layers (e.g., the oxidized etch stop layer 20 and the spacer 14). In any case, the oxidized etch stop layer 20 can act as an etch stop over the metal gate 8 to protect the gate 8 from physical damage during the etching process. Additionally, the oxidized etch stop layer 20 can physically and electrically isolate the gate from the later-formed contact formed in the opening 26 (e.g., contact 28 in FIGS. 6 and 7).

FIG. 6 illustrates the process of forming a contact 28 to the conductive layers 16 in the opening 26. The contact 28 can be formed using any conventional methods (e.g., deposition and/or epitaxial growth), and can be formed of a conventional contact material including one or more of Cu, W, etc. The contact 28 can be formed (e.g., by filling the opening), and additional contact material can be etched back or otherwise removed using conventional methods (e.g., CMP or other polishing/planarizing methods). The oxidized etch stop layer 20 can physically and electrically isolate (or, separate) the metal gate 8 from the contact 28 during, and after, formation of the contact 28. As shown, this final integrated circuit structure 102 includes a substrate 4; a metal gate 8 located over the substrate 4; at least one liner layer (metal liner 10 or high-k liner 12) or over the substrate 4 and substantially surrounding the metal gate 8; and an oxidized etch stop layer 20 located directly over the metal gate 8. As described herein, the oxidized etch stop layer 20 can include of at least one of cobalt (Co), manganese (Mn), or ruthenium (Ru), and is approximately completely oxidized.

FIG. 7 shows an alternative embodiment of an integrated circuit structure 202, where the etch stop layer 20 is only partially oxidized. In this case, the etch stop layer 20 includes a non-oxidized core region 30 directly contacting the metal gate 8, and an outer (or surrounding) region 32 substantially surrounding the core region 30 (but for the portions of the core region 30 contacting the metal gate 8). The outer region 32 can be oxidized using the conventional techniques described herein, and in some cases, is formed by partially oxidizing the etch stop layer 20 during the oxidizing process, such that the core 30 remains non-oxidized.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit structure comprising:
    a substrate;
    a metal gate located over the substrate;
    at least one liner layer over the substrate and substantially surrounding the metal gate;
    a spacer member adjacent the at least one liner layer;
    an at least partially oxidized etch stop layer located directly over the metal gate, the etch stop layer including iridium (Ir) and having a thickness of approximately 0.5 nanometers; and
    wherein the at least partially oxidized etch stop layer is selectively formed over only the metal gate as a metal layer.

2. The integrated circuit structure of claim 1, wherein the etch stop layer is only partially oxidized, wherein only an outer portion of the etch stop layer is oxidized.

3. The integrated circuit structure of claim 1, wherein the etch stop layer is completely oxidized.

4. An integrated circuit structure comprising:
    a substrate;
    a metal gate located over the substrate;
    at least one liner layer over the substrate and substantially surrounding the metal gate;
    an at least partially oxidized etch stop layer located directly over the metal gate, the etch stop layer including iridium (Ir),
    wherein the at least partially oxidized etch stop layer is selectively formed over only the metal gate as a metal layer,
    wherein the at least partially oxidized etch stop layer has a thickness of approximately 0.5 nanometers (nm); and
    a dielectric layer over the at least partially oxidized etch stop layer.

5. The integrated circuit structure of claim 4, further comprising a contact extending through the dielectric layer and contacting the at least partially oxidized etch stop layer.

6. The integrated circuit structure of claim 5, further comprising a spacer member adjacent to the at least one liner layer, wherein the contact contacts the spacer member.

7. The integrated circuit structure of claim 4, wherein the etch stop layer is only partially oxidized, wherein only an outer portion of the etch stop layer is oxidized.

8. The integrated circuit structure of claim 4, wherein the etch stop layer is completely oxidized.

9. An integrated circuit structure comprising:
    a transistor structure having:
        a metal gate;
        a metal liner contacting the metal gate;
        a high-k liner surrounding the metal liner;
        spacers abutting the high-k liner; and
        a conductive layer below and alongside at least one of the spacers;
    an at least partially oxidized etch stop layer over only the metal gate, the metal liner and the high-k liner, exclusive of the spacers,
    wherein the at least partially oxidized etch stop layer has a thickness of approximately 0.5 nanometers (nm),
    wherein the at least partially oxidized etch stop layer includes iridium (Ir);
    a dielectric layer over the etch stop layer; and
    a contact contacting the conductive layer through the dielectric layer.

10. The integrated circuit structure of claim 9, wherein the contact further contacts at least one of the spacers and the at least partially oxidized etch stop layer.

11. The integrated circuit structure of claim 2, wherein the oxidized outer portion of the etch stop layer has a thickness of less than 0.5 nanometers.

12. The integrated circuit structure of claim 7, wherein the oxidized outer portion of the etch stop layer has a thickness of less than 0.5 nanometers.

13. The integrated circuit structure of claim 9, wherein the at least partially oxidized etch stop layer is only partially oxidized, wherein only an outer portion of the etch stop layer is oxidized, and wherein the oxidized outer portion of the etch stop layer has a thickness of less than 0.5 nanometers.

* * * * *